(12) United States Patent
Lim et al.

(10) Patent No.: US 10,838,266 B2
(45) Date of Patent: Nov. 17, 2020

(54) DISPLAY DEVICE

(71) Applicant: Samsung Electronics Co., Ltd., Gyeonggi-do (KR)

(72) Inventors: Sang-Ho Lim, Gyeonggi-do (KR); Seung-Tae Ko, Gyeonggi-do (KR); Yoon-Geon Kim, Seoul (KR); Won-Bin Hong, Seoul (KR)

(73) Assignee: Samsung Electronics Co., Ltd (KR)

(*) Notice: Subject to any disclaimer, the term of this patent is extended or adjusted under 35 U.S.C. 154(b) by 0 days.

(21) Appl. No.: 16/423,633

(22) Filed: May 28, 2019

(65) Prior Publication Data

US 2019/0278130 A1    Sep. 12, 2019

Related U.S. Application Data

(62) Division of application No. 15/165,698, filed on May 26, 2016, now Pat. No. 10,324,327.

(30) Foreign Application Priority Data

May 27, 2015   (KR) .................. 10-2015-0074001
Oct. 12, 2015   (KR) .................. 10-2015-0142227

(51) Int. Cl.
*G02F 1/1343*   (2006.01)
*H01L 27/32*   (2006.01)
(Continued)

(52) U.S. Cl.
CPC .. *G02F 1/134309* (2013.01); *G02F 1/133512* (2013.01); *H01L 27/3225* (2013.01);
(Continued)

(58) Field of Classification Search
CPC ........ G06F 1/1698; H01Q 1/243; H01Q 7/00; H01L 2223/6677; H01L 27/3225;
(Continued)

(56) References Cited

U.S. PATENT DOCUMENTS

| 7,336,270 | B2* | 2/2008 | Sato ................ G06K 19/07749 |
| | | | 345/204 |
| 2005/0003640 | A1* | 1/2005 | Ushiyama .............. H01L 27/12 |
| | | | 438/502 |

(Continued)

FOREIGN PATENT DOCUMENTS

| CN | 102347527 | 2/2012 |
| CN | 103733373 | 4/2014 |

(Continued)

OTHER PUBLICATIONS

European Search Report dated May 29, 2018 issued in counterpart application No. 16800287.1-1212, 9 pages.

(Continued)

*Primary Examiner* — Jia X Pan
(74) *Attorney, Agent, or Firm* — The Farrell Law Firm, P.C.

(57) ABSTRACT

Display devices are provided. In a display device, a plurality of pixels are arranged with an interval therebetween, an antenna radiator is configured with one or more conductors that are arranged between the plurality of pixels, and partition walls are disposed between the plurality of pixels. Each of the one or more conductors is disposed on one surface of the corresponding partition wall.

10 Claims, 17 Drawing Sheets

(51) Int. Cl.
  *G02F 1/1335* (2006.01)
  *H01Q 1/00* (2006.01)
  *H01Q 1/24* (2006.01)
(52) U.S. Cl.
  CPC .............. *H01Q 1/00* (2013.01); *H01Q 1/243* (2013.01); *H01L 27/3246* (2013.01); *H01L 2223/6677* (2013.01)
(58) Field of Classification Search
  CPC .............. H01L 27/3246; G02F 1/1343; G02F 1/134309; G02F 1/133512; H04B 5/0081
  See application file for complete search history.

(56) References Cited

U.S. PATENT DOCUMENTS

| | | | | |
|---|---|---|---|---|
| 2007/0210705 | A1* | 9/2007 | Yokoi | H01L 51/50 313/506 |
| 2009/0014529 | A1 | 1/2009 | Gelbman | |
| 2009/0051620 | A1 | 2/2009 | Ishibashi et al. | |
| 2009/0254428 | A1* | 10/2009 | Sterling | G06Q 20/20 705/14.65 |
| 2009/0254438 | A1* | 10/2009 | Johnson, Jr. | G07G 1/12 705/17 |
| 2010/0260460 | A1 | 10/2010 | Harrysson et al. | |
| 2011/0320295 | A1 | 12/2011 | Johnson, Jr. et al. | |
| 2012/0228603 | A1* | 9/2012 | Nakamura | H01L 51/5253 257/40 |
| 2014/0080411 | A1 | 3/2014 | Konanur et al. | |
| 2014/0231766 | A1 | 8/2014 | Kim et al. | |
| 2014/0253613 | A1 | 9/2014 | Gilbert | |
| 2014/0284572 | A1* | 9/2014 | Oooka | H01L 27/322 257/40 |
| 2014/0293187 | A1 | 10/2014 | Nam | |
| 2015/0003040 | A1* | 1/2015 | Bessho | F21V 9/40 362/84 |
| 2015/0035445 | A1* | 2/2015 | Tanaka | H05B 45/60 315/200 R |
| 2015/0144934 | A1 | 5/2015 | Rappoport et al. | |
| 2017/0179168 | A1 | 6/2017 | Suzuki et al. | |

FOREIGN PATENT DOCUMENTS

| | | |
|---|---|---|
| CN | 104067163 | 9/2014 |
| KR | 1020080002909 | 1/2008 |

OTHER PUBLICATIONS

International Search Report dated Jul. 27, 2016 issued in counterpart application No. PCT/KR2016/005480, 10 pages.
Chinese Office Action dated Aug. 5, 2019 issued in counterpart application No. 201680030582.5, 13 pages.
Chinese Office Action dated Apr. 10, 2020 issued in counterpart application No. 201680030582.5, 13 pages.

* cited by examiner

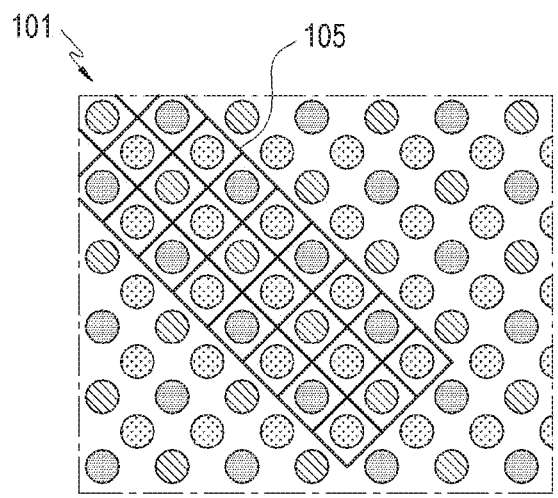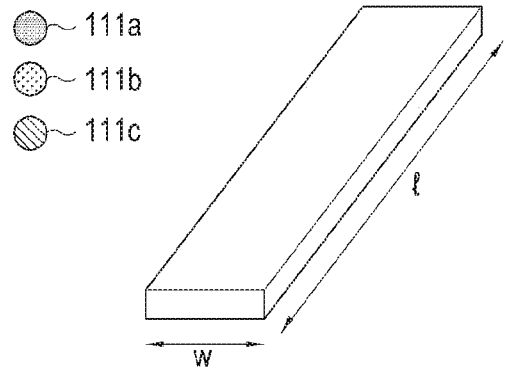
FIG.6A  FIG.6B
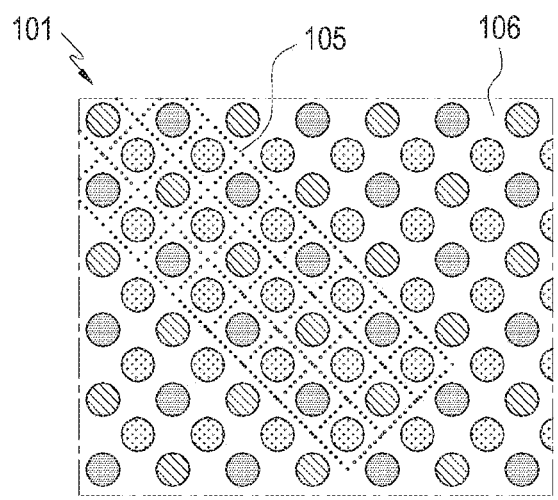
FIG.7

DISPLAY DEVICE

PRIORITY

This application is a Divisional Application of U.S. Ser. No. 15/165,698, which was filed in the U.S. Patent and Trademark Office on May 26, 2016, and claims priority under 35 U.S.C. § 119(a) to Korean Patent Applications filed on May 27, 2015 and Oct. 12, 2015, respectively, in the Korean Intellectual Property Office and assigned Serial Nos. 10-2015-0074001 and 10-2015-0142227, respectively, the entire content of each of which is incorporated herein by reference.

BACKGROUND

1. Field of the Disclosure

The present disclosure relates generally to a display device, and more particularly, to a display device having an internal antenna device for implementing a wireless communication function.

2. Description of the Related Art

Wireless communication technologies have recently been implemented in various manners, such as a wireless local area network (WLAN) represented by a wireless fidelity (Wi-Fi) technology, Bluetooth, near field communication (NFC), etc., as well as commercialized mobile communication network access. Mobile communication services have evolved from voice call based first-generation mobile communication services into fourth-generation mobile communication networks, thereby making utilization of the Internet and multimedia services on a mobile communication terminal possible. Next-generation mobile communication services, which will be commercialized in the future, are expected to be provided through an ultra-high frequency band of tens of gigahertz (GHz) or more. For example, the majority of mobile communication terminals that implement the long term evolution (LTE) technology by the 3GPP standard, which has been widely used as a representative of the fourth-generation (4G) mobile communication all over the world, must basically support a band of 700 megahertz (MHz) to 960 MHz and a band of 2.5 GHz to 2.7 GHz.

Further, with the activation of communication standards (such as WLAN, Bluetooth, etc.), electronic devices, for example, mobile communication terminals, have been equipped with antenna devices that operate in different frequency bands. For example, fourth-generation mobile communication services may operate in a frequency band of 700 MHz, 1.8 GHz, 2.1 GHz, etc.; Wi-Fi may operate in a frequency band of 2.4 GHz and 5 GHz but with a slight difference depending on the standard implemented; and Bluetooth may operate in a frequency band of 2.45 GHz.

Electronic devices require antenna devices in order to make wireless communication possible. The antenna devices are installed with a sufficient distance from other devices to prevent the antenna devices from interfering with the other devices when transmitting and receiving high frequency signals.

These antenna devices are required to have excellent radiation performance and a wide band width even within a small volume in order to conform to the design trend of electronic devices that is moving toward slimness and compactness. For example, as antenna areas where internal antenna devices may be embedded in electronic devices have become narrower, it is an important issue in antenna design to obtain excellent radiation performance without varying the sizes of the antenna devices.

In cases where antenna devices are embedded in touch panels of electronic devices, the electronic devices may be made compact by reducing the spaces where the antenna devices are mounted in the electronic devices, but the touch functions of the touch panels and the radiation performance of the antenna devices may degrade.

Further, in the cases where antenna devices are embedded in display devices of electronic devices, the antenna devices may interfere with the movement of light within the display devices, thereby deteriorating the quality of the display devices.

SUMMARY

In accordance with an aspect of the present disclosure, a display device is provided. The display device includes a plurality of pixels arranged with an interval therebetween, an antenna radiator configured with one or more conductors that are arranged between the plurality of pixels, and partition walls disposed between the plurality of pixels. Each of the one or more conductors is disposed on one surface of the corresponding partition wall.

In accordance with another aspect of the present disclosure, a display device is provided. The display device includes a substrate, a plurality of light emitting parts arranged on the substrate with an interval therebetween, and an antenna radiator configured with one or more conductors that are arranged between the substrate and the light emitting parts. The substrate comprises a plurality of transistors that are arranged to correspond to the respective light emitting parts.

BRIEF DESCRIPTION OF THE DRAWINGS

The above and other aspects, features, and advantages of the present disclosure will be more apparent from the following detailed description, taken in conjunction with the accompanying drawings, in which:

FIGS. 6A and 6B are plan views illustrating an antenna radiator of a display device according to an embodiment of the present disclosure;

FIG. 7 is a view illustrating a state in which conductors of a display device, according to an embodiment of the present disclosure, are covered with a light shielding part;

DETAILED DESCRIPTION OF EMBODIMENTS OF THE PRESENT DISCLOSURE

Figure 1:
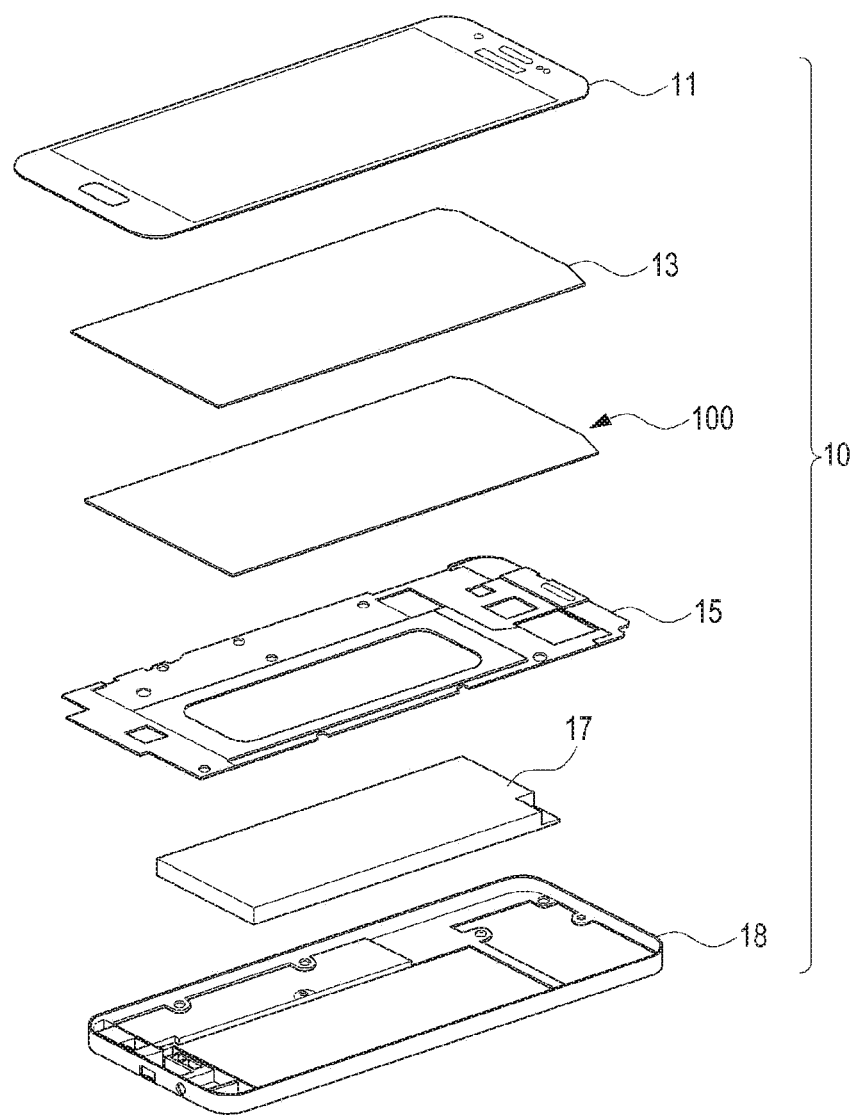
FIG. 1 is an exploded perspective view illustrating an electronic device according to an embodiment of the present disclosure.

Hereinafter, various embodiments of the present disclosure will be described with reference to the accompanying drawings. However, it should be understood that there is no intent to limit the present disclosure to the particular forms disclosed herein; rather, the present disclosure is intended to be construed to cover various modifications, equivalents, and/or alternatives of the present disclosure that are within the scope of the present disclosure as defined by the appended claims and their equivalents. In describing the accompanying drawings, similar reference numerals may be used to designate similar constituent elements.

In the present disclosure, the expressions "have," "may have," "include," and "may include" refer to the existence of a corresponding feature (e.g., a numerical value, a function, an operation, or components such as elements), but do not exclude the existence of additional features.

In various embodiments of the present disclosure, the expressions "A or B," "at least one of A and/or B," and "one or more of A and/or B" may include all possible combinations of the items listed. For example, the expressions "A or B," "at least one of A and B," and "at least one of A or B," refer to all of (1) including at least one A, (2) including at least one B, and (3) including all of at least one A and at least one B.

The expressions "a first," "a second," "the first," and "the second" used in various embodiments of the present disclosure may modify various components regardless of order and/or importance but do not limit the corresponding components. For example, a first user device and a second user device indicate different user devices although both of them are user devices. For example, a first element may be referred to as a second element, and similarly, a second element may be referred to as a first element without departing from the scope and spirit of the present disclosure.

It should be understood that when an element (e.g., a first element) is referred to as being (operatively or communicatively) "connected," or "coupled," to another element (e.g., a second element), it may be directly connected or directly coupled to the other element and another element (e.g., a third element) may be interposed therebetween. In contrast, it may be understood that when an element (e.g., a first element) is referred to as being "directly connected," or "directly coupled" to another element (e.g., a second element), there is no element (e.g., a third element) interposed therebetween.

The terms used herein are merely for the purpose of describing certain embodiments but are not intended to limit the scope of the present disclosure. As used herein, singular forms may include plural forms as well unless the context clearly indicates otherwise. Unless defined otherwise, all terms used herein have the same meanings as those commonly understood by a person skilled in the art to which the present disclosure pertains. Such terms as those defined in a generally used dictionary may be interpreted to have the same meanings as the contextual meanings in the relevant field of art, and are not to be interpreted to have ideal or excessively formal meanings unless clearly defined in the present disclosure. In some cases, even a term defined in the present disclosure should not be interpreted to exclude embodiments of the present disclosure.

An electronic device according to various embodiments of the present disclosure may include a touch panel, and the electronic device may be referred to as a terminal, a portable terminal, a mobile terminal, a communication terminal, a portable communication terminal, a portable mobile terminal, a display device or the like.

For example, an electronic device may be a smartphone, a portable phone, a game player, a TV, a display unit, a heads-up display unit for a vehicle, a notebook computer, a laptop computer, a tablet personal computer (PC), a personal media player (PMP), a personal digital assistant (PDA), and the like. An electronic device may be implemented as a pocket-sized portable communication terminal having a wireless communication function. Further, an electronic device may be a flexible device or a flexible display device.

An electronic device may communicate with an external electronic device, such as a server or the like, or perform an operation through an interworking with the external electronic device. For example, an electronic device may transmit an image photographed by a camera and/or position information detected by a sensor unit to a server through a network. A network may be a mobile or cellular communication network, a local area network (LAN), a WLAN, a wide area network (WAN), an Internet, a small area network (SAN) or the like, but is not limited thereto.

FIG. 1 is an exploded perspective view illustrating an electronic device 10 according to an embodiment of the present disclosure.

Referring to FIG. 1, the electronic device 10, according to an embodiment of the present disclosure, may include a front cover 11, a touch panel 13, a display device 100, a frame 15, a battery 17, and a back cover 18. The electronic device 10 may be a smart phone. The front cover 11 may protect the interior of the electronic device 10 while forming the front of the electronic device 10. The front cover 11 may be formed of glass. Without being limited thereto, however, the front cover 11 may be formed of various materials, such as reinforced plastics. Further, the front cover 11 is illustrated as having a flat plate shape, but the front cover 11 may have a three-dimensional shape that has opposite curved lateral surfaces.

The touch panel 13 may be disposed on the back of the front cover 11 to provide a function of an input device. The touch panel 13 may be integrally manufactured with the front cover 11.

The display device 100 may receive an electrical signal to output an image or video to the front cover 11. The display device 100 may be integrally manufactured with the touch panel 13 as well as the front cover 11. For example, the front cover 11, the touch panel 13, and the display device 100 may be sequentially stacked one above the other. However, the electronic device 10 is not limited to the structure in which the front cover 11, the touch panel 13, and the display device 100 are sequentially stacked one above the other.

The frame 15 may be provided on the back of the display device 100 to support the electronic device 10 as well as the display device 100. The frame 15 may be formed of metal, but without being limited thereto, may be formed of various materials with rigidity.

The battery 17 may be disposed on the back of the frame 15 to supply electrical power to the electronic device 10.

The back cover 18 may be disposed on the back of the battery 17 to protect the back of the electronic device 10. Further, the back cover 18 may be equipped with a circuit board on which various types of electronic components (such as, a chip set, a communication module, a storage module, etc.) of the electronic device 10 are mounted.

Figure 2:
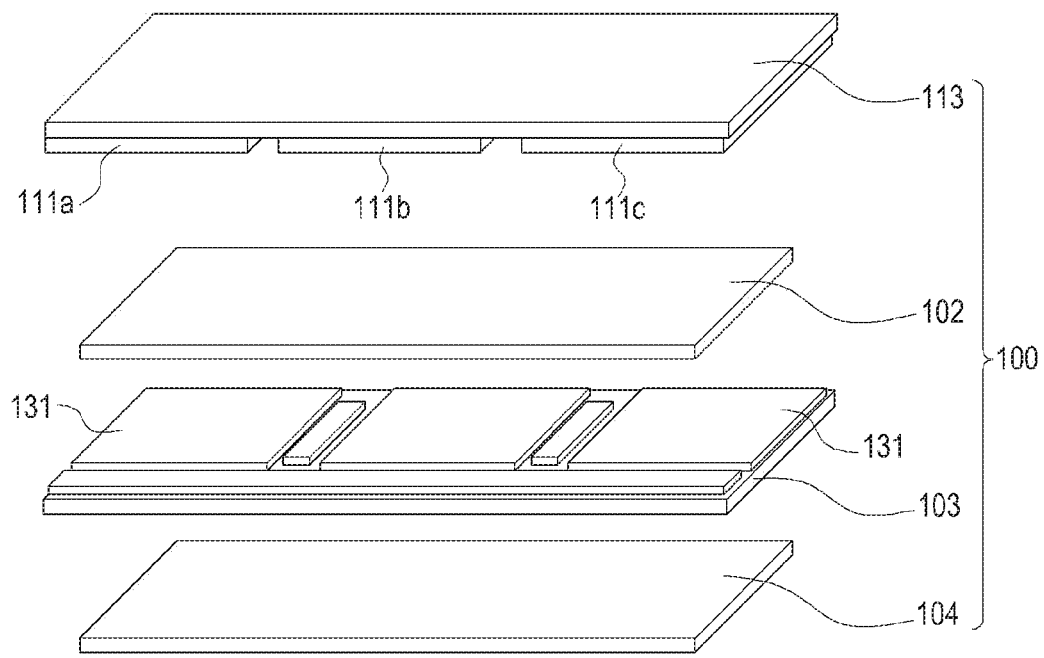
FIG. 2 is an exploded perspective view illustrating a display device according to an embodiment of the present disclosure.
Figure 3:
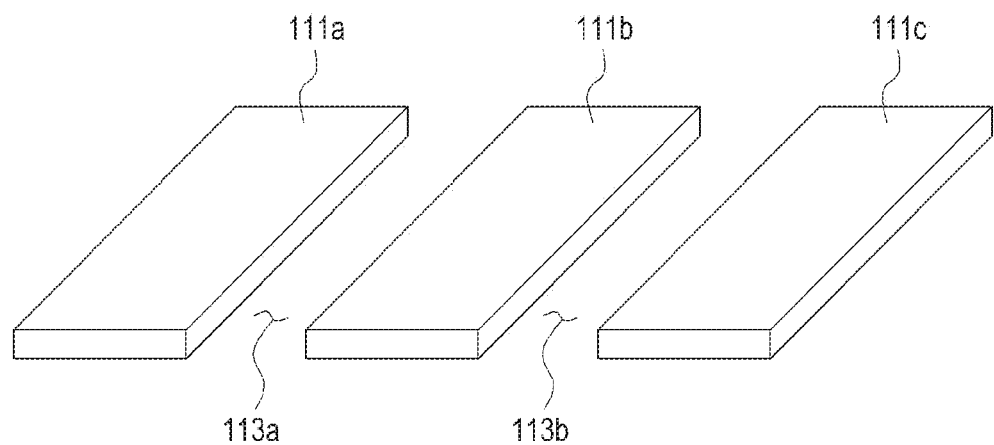
FIG. 3 is a perspective view illustrating pixels of a display device according to an embodiment of the present disclosure.
Figure 4:
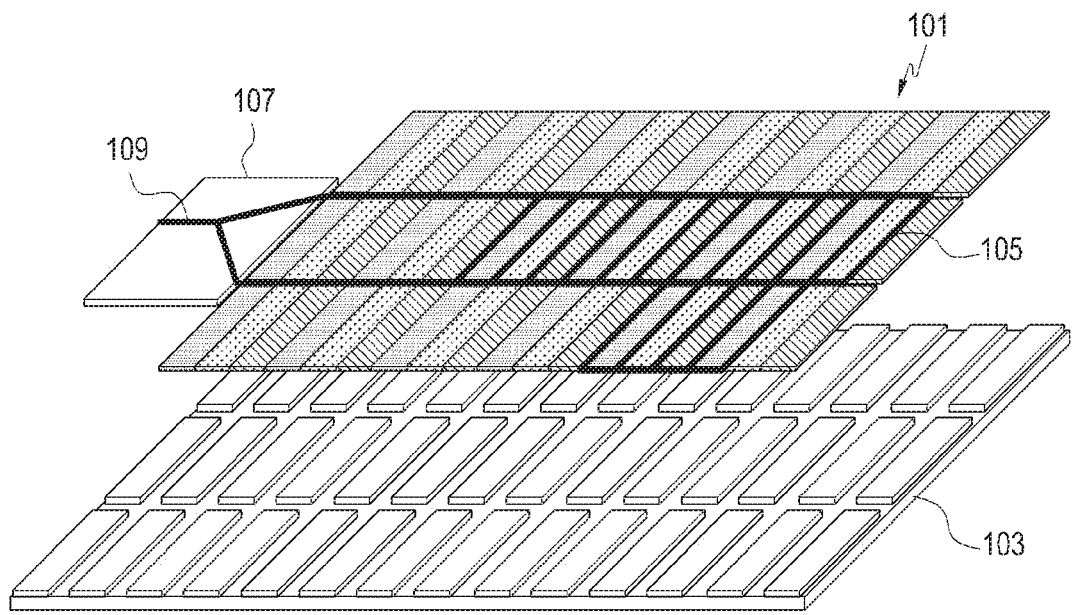
FIG. 4 is a view illustrating an antenna radiator and a feeding printed circuit board (PCB) of a display device according to an embodiment of the present disclosure.

FIG. 2 is an exploded perspective view illustrating the display device 100 according to an embodiment of the present disclosure. FIG. 3 is a perspective view illustrating pixels of the display device 100 according to an embodiment of the present disclosure. FIG. 4 is a view illustrating an antenna radiator and a feeding PCB of the display device 100 according to an embodiment of the present disclosure.

The display device 100, according to an embodiment of the present disclosure, may be part of a smart phone. Without being limited thereto, however, the display device 100 may be wearable device, such as a smart watch, etc.

Referring to FIGS. 2 to 4, the display device 100, according to an embodiment of the present disclosure, may include a plurality of each of pixels 111a, 111b, and 111c, a liquid crystal layer 102, transistors 131, a back-light 104, an antenna radiator 105, and a feeding PCB 107. While there are a plurality of each of pixels 111a, 111b, and 111c, one of each of pixels 111a, 111b, and 111c are shown in FIG. 2 for ease of explanation.

The plurality of pixels 111a, 111b, and 111c may be arranged on a first substrate 113 with an interval between pixels to form an output layer. The pixels 111a, 111b, and 111c may output one of red, green, and blue. For example, the pixels 111a, 111b, and 111c may receive light output from the back-light 104 through the liquid crystal layer 102 to output one of red, green, and blue. The pixels 111a, 111b, and 111c may include the first pixels 111a that output red, the second pixels that output green, and the third pixels 111c that output blue. The first pixels 111a may be arranged with a first interval 113a away from the second pixels 111b. The second pixels 111b may be arranged with a second interval 113b away from the third pixels 111c. The first interval 113a and the second interval 113b may be equal to each other, but without being limited thereto, may differ from each other.

The liquid crystal layer 102 may be disposed on the pixels 111a, 111b, and 111c. The liquid crystal layer 102 may have liquid crystals oriented in a predetermined direction, and which may be oriented in a different direction by an electrical signal. The liquid crystal layer 102 may change a travel direction of light transmitted to the liquid crystal layer 102 according to a change in the orientation of the liquid crystals.

The transistors 131 may be disposed on the liquid crystal layer 102. The transistors 131 may be arranged on a second substrate 103 to correspond to the pixels 111a, 111b, and 111c, respectively. The transistors 131 may apply an electrical signal to the liquid crystal layer 102 to change the orientation of the liquid crystals in the liquid crystal layer 102.

The back-light 104 may be disposed on the second substrate 103 and may output light toward the liquid crystal layer 102. The back-light 104 may be one of a cold cathode fluorescent lamp (CCFL), an external electrode fluorescent lamp (EEFL), a light emitting diode (LED), and a flat fluorescent lamp (FFL). Without being limited thereto, however, the back-light 104 may be one of various light source devices that output light. The light output from the back-light 104 may be transmitted to the pixels 111a, 111b, and 111c via the liquid crystal layer 102.

The antenna radiator 105 may be formed of one or more conductors that are arranged between the pixels 111a, 111b, and 111c. The antenna radiator 105 may be located in the layer that is formed by the pixels 111a, 111b, and 111c. The antenna radiator 105 may receive electrical power to form at least one resonant frequency. The antenna radiator 105 may not affect the colors output from the pixels 111a, 111b, and 111c, because the conductors of the antenna radiator 105 are arranged between the pixels 111a, 111b, and 111c. In addition, since the conductors of the antenna radiator 105 are arranged between the pixels 111a, 111b, and 111c, the antenna radiator 105 may not need to be separately mounted within the electronic device 10 that includes the display device 100, which makes it possible to make the electronic device 10 more compact.

The feeding PCB 107 may be connected to one end of the output layer 101 and may include a feeding line 109 that is connected to the conductors of the antenna radiator 105. The feeding line 109 may supply an electrical signal to the antenna radiator 105 such that the antenna radiator 105 may form a resonant frequency.

Figure 5:
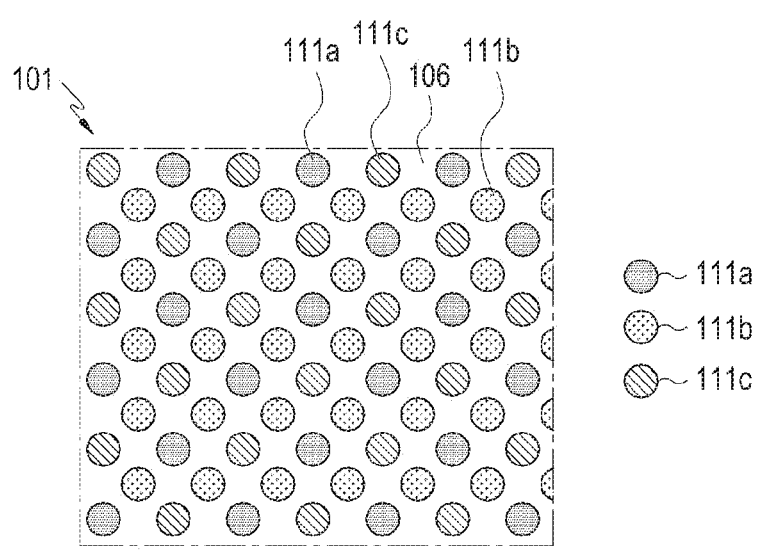
FIG. 5 is a plan view illustrating pixels of a display device according to an embodiment of the present disclosure.

FIG. 5 is a plan view illustrating pixels of a display device 100 according to an embodiment of the present disclosure.

Referring to FIG. 5, the pixels 111a, 111b, and 111c of the display device 100, according to an embodiment of the present disclosure, may have a circular shape. Without being limited thereto, however, the pixels 111a, 111b, and 111c may have various shapes, such as a rhombic shape, a rectangular shape, etc. Furthermore, the pixels 111a, 111b, and 111c may be the same size, but the present disclosure is not limited thereto. For example, the pixels 111a, 111b, and 111c may be configured such that the first pixels 111a output red, the second pixels 111b output green, and the third pixels 111c output blue. The second pixels 111b may be smaller in size than either of the third pixels 111c and the first pixels 111a, and the third pixels 111c may be smaller in size than the first pixels 111a.

A light shielding part 106 may be provided between the pixels 111a, 111b, and 111c. The light shielding part 106 may prevent light from passing between the pixels 111a, 111b, and 111c toward the back-light 104 (illustrated in FIG. 2). The light shielding part 106 may be formed of carbon black. Without being limited thereto, however, the light shielding part 106 may be formed of a material that can absorb light, or a material that can selectively reflect light. The light shielding part 106 may prevent interference between the colors that are output from the pixels 111a, 111b, and 111c. Further, the light shielding part 106 may absorb light that enters the display device 100 from the outside.

FIGS. 6A and 6B are plan views illustrating an antenna radiator of the display device 100 according to an embodiment of the present disclosure.

Referring to FIGS. 6A and 6B, the antenna radiator 105 may have a plurality of conductors that extend between the pixels 111a, 111b, and 111c to cross each other, thereby forming a mesh. The mesh form of the antenna radiator 105 may reduce damage caused by the resistance component of the conductors when a signal current is distributed in the antenna radiator 105.

Further, the resonant frequency band of the antenna radiator 105 may be determined according to the resistivity, length (l), and line width (w) of the conductors. For example, the resistance of each conductor may be proportional to the resistivity and length thereof, and may be inversely proportional to the line width thereof.

The antenna radiator 105 may form a resonant frequency band that is inversely proportional to the resistance of the conductors. For example, the antenna radiator 105 may form a high resonant frequency band when the conductors have a low resistance. By regulating the resistance of the conductors, it is possible to set the frequency band of the antenna radiator 105 within the display device 100.

FIG. 7 is a view illustrating a state in which the conductors of the display device 100, according to an embodiment of the present disclosure, are covered with a light shielding part.

Referring to FIG. 7, the antenna radiator 105 may be covered with the light shielding part 106. The light shielding part 106 may cover the antenna radiator 105 in order to prevent the antenna radiator 105 from affecting the colors that are output from the pixels 111a, 111b, and 111c.

Figure 8:
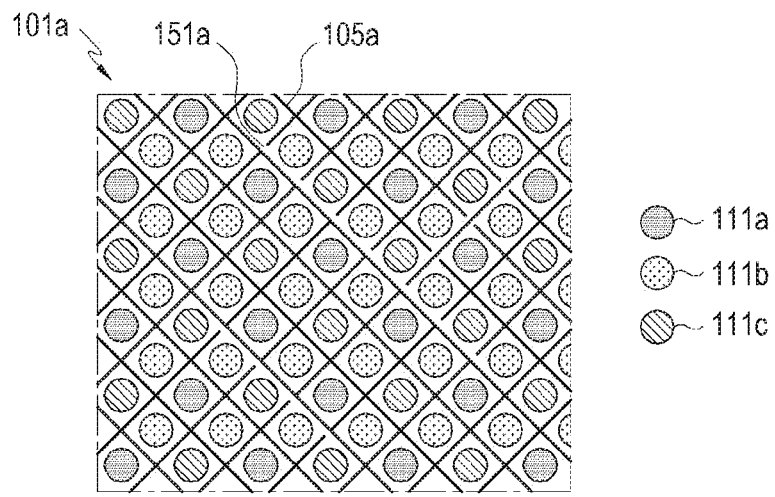
FIG. 8 is a plan view illustrating an antenna radiator of a display device according to an embodiment of the present disclosure.

FIG. 8 is a plan view illustrating an antenna radiator of a display device 100 according to an embodiment of the present disclosure.

Referring to FIG. 8, the antenna radiator 105, which is applied to the display device 100 according to an embodiment of the present disclosure, may include cut-off portions 151a where conductors are partially removed. The cut-off portions 151a of the antenna radiator 105 may change the entire length of the conductors or the electrical connection state of the conductors. For example, the antenna radiator 105 may form various frequency bands according to the number of the cut-off portions 151a and the positions of the cut-off portions 151a.

Figure 9:
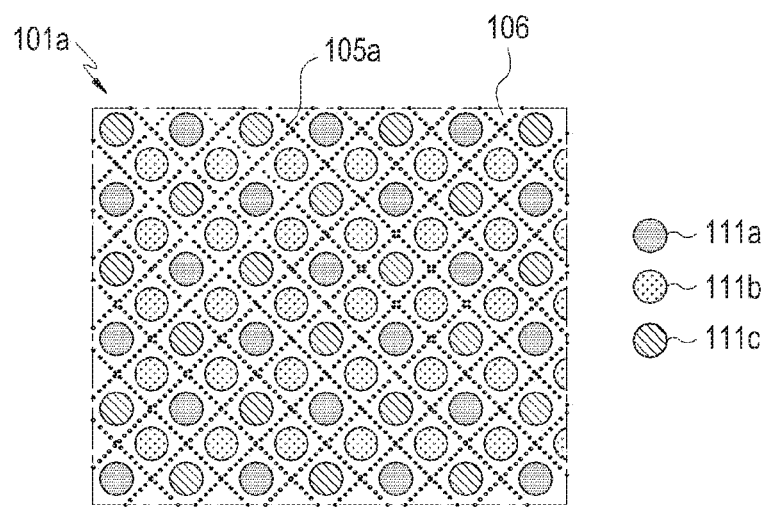
FIG. 9 is a view illustrating a state in which conductors of a display device, according to an embodiment of the present disclosure, are covered with a light shielding part.

FIG. 9 is a view illustrating a state in which the conductors of the display device 100, according to an embodiment of the present disclosure, are covered with a light shielding part.

Referring to FIG. 9, the antenna radiator 105 may be covered with the light shielding part 106. The cut-off portions 151a of the antenna radiator 105 may be filled with the light shielding part 106.

Figure 10:
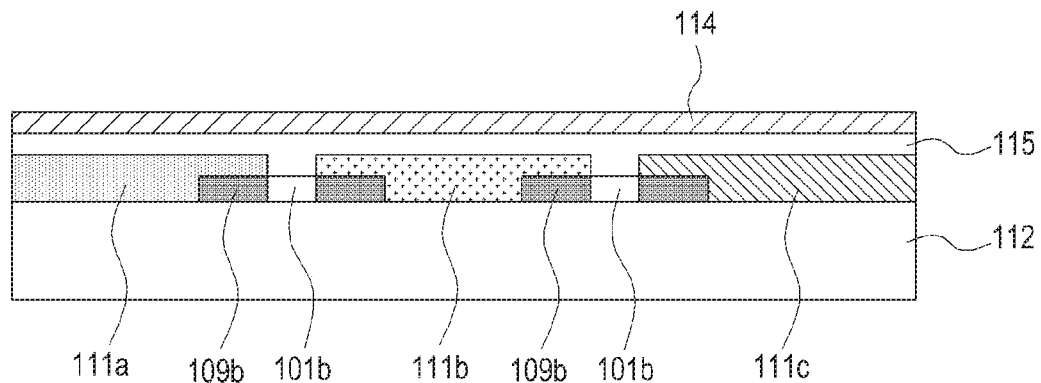
FIG. 10 is a sectional view illustrating a part of a display device according to an embodiment of the present disclosure.

FIG. 10 is a sectional view illustrating a part of the display device 100 according to an embodiment of the present disclosure.

Referring to FIG. 10, the display device 100, according to an embodiment of the present disclosure, may include a glass substrate 112, pixels 111a, 111b, and 111c, conductors 101b, light shielding parts 109b, a coating layer 115, and a common electrode 114.

The glass substrate 112 may be disposed on the pixels 111a, 111b, and 111c to protect the pixels 111a, 111b, and 111c. Further, the glass substrate 112 may be formed of a polarizing glass.

The conductors 101b may be disposed between the pixels 111a, 111b, and 111c and may be surrounded by the light shielding parts 109b. For example, the conductors 101b may be hidden by the light shielding parts 109b in order to prevent interference with the colors that are output from the adjacent pixels 111a, 111b, and 111c.

The light shielding parts 109b may conceal a part of the surfaces of the pixels 111a, 111b, and 111c, for example, a part of the surfaces through which the colors are output from the pixels 111a, 111b, and 111c. Accordingly, the light shielding parts 109b may absorb light that enters the display device 100 externally.

The coating layer 115 may be formed on the pixels 111a, 111b, and 111c. Further, the coating layer 115 may fill areas between the pixels 111a, 111b, and 111c.

The common electrode 114 may be connected to the transistors 131 to apply a voltage to the liquid crystal layer 102.

Figure 11:
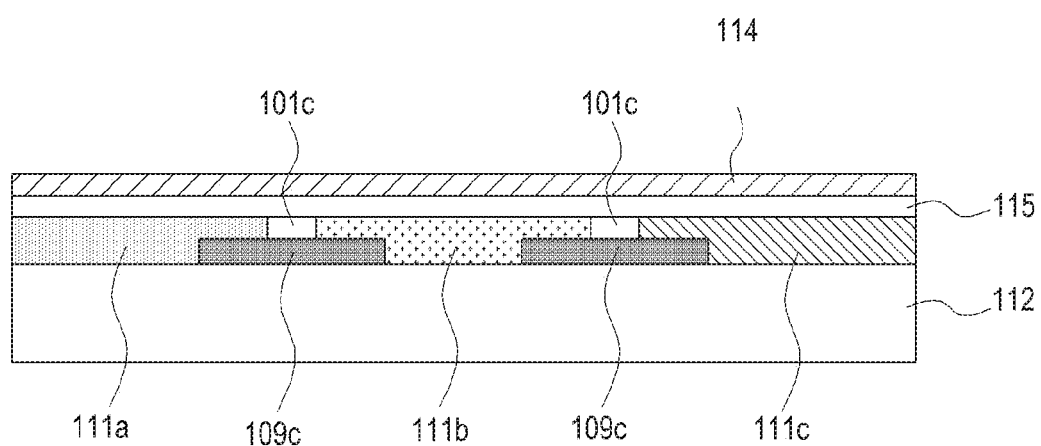
FIG. 11 is a sectional view illustrating a part of a display device according to an embodiment of the present disclosure.

FIG. 11 is a sectional view illustrating a part of a display device 100 according to an embodiment of the present disclosure. Detailed descriptions of elements similar to those described above are omitted here.

Referring to FIG. 11, a conductor 101c that is applied to the display device 100, according to an embodiment of the present disclosure, may be disposed on one surface of a light shielding part 109c. For example, the conductor 101c may be stacked on the light shielding part 109c. In the manufacturing of the display device 100 that has the stack structure, the conductor 101c may be arranged between pixels 111a, 111b, and 111c, and the light shielding part 109c may then be stacked on the pixels 111a, 111b, and 111c.

Figure 12:
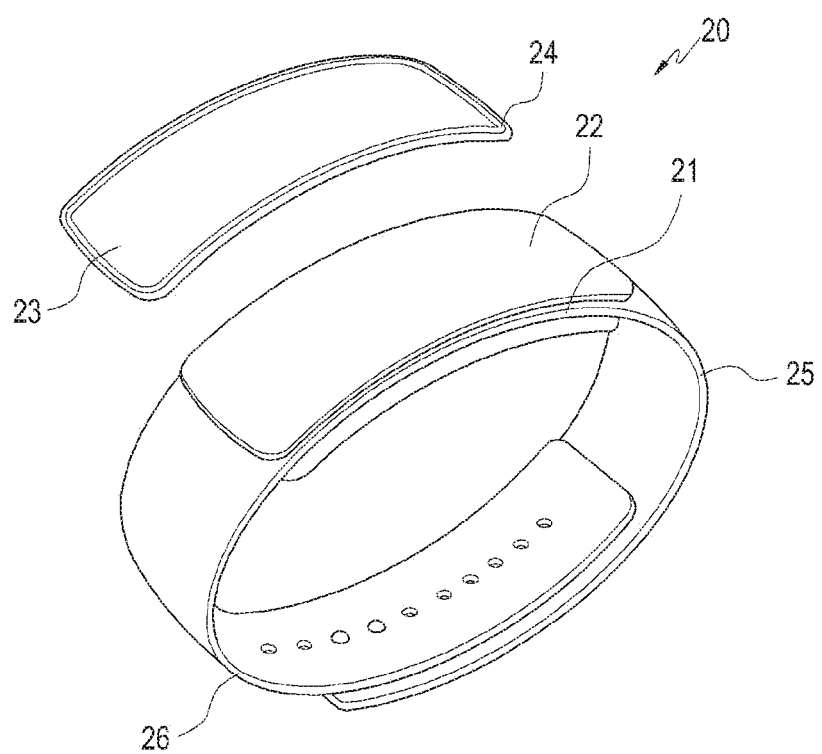
FIG. 12 is an exploded perspective view illustrating an electronic device according to an embodiment of the present disclosure.

FIG. 12 is an exploded perspective view illustrating an electronic device 20 according to an embodiment of the present disclosure.

The electronic device 20 may be a portable electronic device (such as a mobile communication terminal, etc.) or one of various electronic devices that can be worn on a user's body. In an embodiment, the electronic device 10 may be a smart watch.

Referring to FIG. 12, the electronic device 20 may include wearable parts 25 and 26 that extend from opposite sides (or opposite ends) of a housing 21 in opposite directions. The wearable parts 25 and 26 may be coupled to each other while overlapping each other in order to enable the electronic device 20 to be worn on the user's body (e.g., worn on a wrist). The housing 21 may be formed of metal, or the outer periphery of the housing 21 may be formed of metal. The housing 21 may accommodate various types of devices (such as, an application processor (AP), a communication module, a memory, a battery, etc.) therein, and may include a display device 22 mounted on one surface thereof. The display device 22 may include a liquid crystal display (LCD), an LED display, an organic LED (OLED) display, a micro electro mechanical system (MEMS) display, or an electronic paper display. The display device 22 may output various types of content (e.g., a photograph, a video, etc.), and may output execution screens of various applications (e.g., a game application, an Internet banking application, a schedule management application, etc.) according to an operation of a user. Further, the aforementioned antenna radiator 105 may be embedded in the display device 22 according to an embodiment of the present disclosure. In addition, a touch screen panel may be mounted on the display device 22 if the electronic device 20 has the function of a touch screen.

A window member 23 may be mounted on the front of the housing 21 to protect the display device 22. The window member 23 may be formed of a transparent material (e.g., glass or a synthetic resin (e.g., acrylic resin, polycarbonate, etc.)) to protect the display device 22 from an external environment while transmitting the screen output from the display device 22. A bezel 24 may be formed on the outer periphery of the window member 23. The bezel 24 may be formed of metal in order to make the external appearance of the electronic device 20 more appealing.

Figure 13:
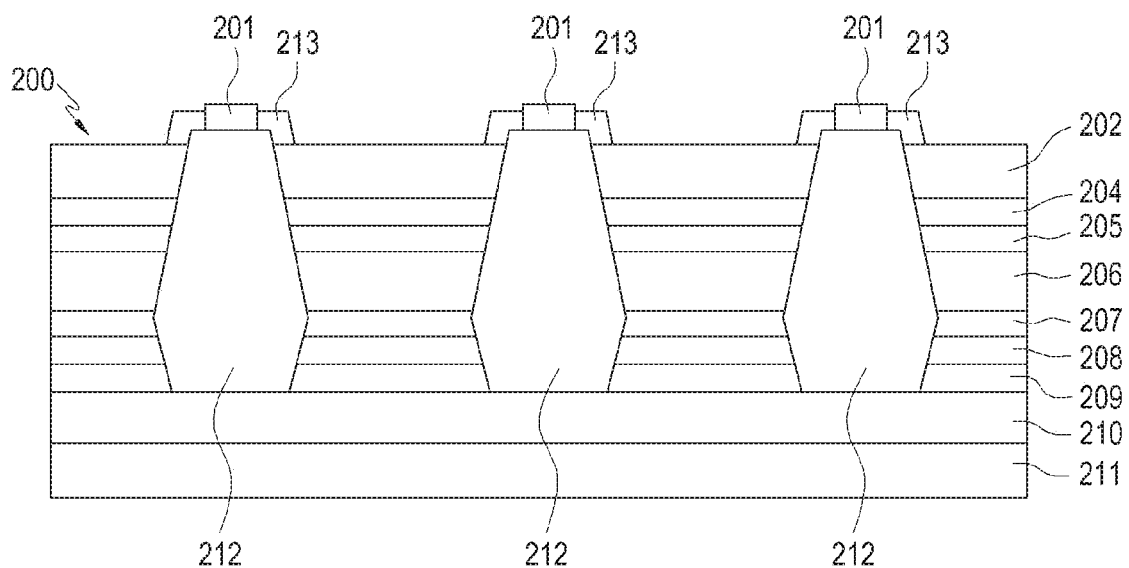
FIG. 13 is a sectional view illustrating a display device according to an embodiment of the present disclosure.

FIG. 13 is a sectional view illustrating a display device 200 according to an embodiment of the present disclosure.

Referring to FIG. 13, the display device 200, according to the embodiment of the present disclosure, may include a light emitting layer 206, partition walls 212, conductors 201, hole transport layers 207 and 208, a positive electrode 209, electron transport layers 204 and 205, a negative electrode 202, and a transistor substrate 210.

The light emitting layer 206 may output light by itself as opposed to the above-described embodiments. Further, the light emitting layer 206 may output one of red, green, and blue light.

The hole transport layers 207 and 208 may be disposed on a first surface of the light emitting layer 206 to provide a path through which holes are transported to the light emitting layer 206.

The positive electrode 209 may be disposed on the hole transport layers 207 and 208 to supply holes to the hole transport layers 207 and 208.

The electron transport layers 204 and 205 may be disposed on a second surface of the light emitting layer 206 to provide a path through which electrons are transported to the light emitting layer 206.

The negative electrode 202 may be disposed on the electron transport layers 204 and 205 and may generate electrons to supply the same to the electron transport layers 204 and 205.

Pixels may be formed by sequentially stacking the negative electrode 202, the electron transport layers 204 and 205, the light emitting layer 206, and the hole transport layers 207 and 208. The partition walls 212 may be disposed between the pixels to separate the pixels from each other. Further, the light emitting layer 206 may include a plurality of light emitting parts that are arranged with an interval therebetween by the partition walls 212.

The conductors 201 may be arranged between the pixels, and may be disposed on the partition walls 212, respectively. The conductors 201 may be formed of aluminum. Without being limited thereto, however, the conductors 201 may be formed of various materials capable of transmitting and receiving electrical waves.

The top of each partition wall 212 may not be coplanar with the negative electrode 202 to prevent the corresponding conductor 201 from being connected to the negative electrode 202. Further, the display device 200, according to an embodiment of the present disclosure, may further include insulating parts 213 that are provided between the conductors 201 and the negative electrode 202. The insulating parts 213 may be formed of an inorganic material to electrically insulate the conductors 201 from the negative electrode 202. However, the insulating parts 213 may be formed of various materials capable of blocking an electrical connection therebetween without being limited thereto.

The transistor substrate 210 may be disposed on the positive electrode 209 to adjust an electrical signal to be supplied to the positive electrode 209. The transistor substrate 210 may include a plurality of transistors, and the transistors may be arranged to correspond to the respective light emitting parts.

The light emitting layer 206 may output light by virtue of holes transported from the hole transport layers 207 and 208 and electrons transported from the electron transport layers 204 and 205. In this case, the light emitting layer 206 may output light toward the negative electrode 202. The conductors 201 are disposed on the partition walls 212 so that the conductors 201 may be separate from the travel path of the light. Accordingly, it is possible to prevent the conductors 201 from interfering with light output from the light emitting layer 206.

Further, according to an embodiment of the present disclosure, light output from the light emitting layer 206 may pass through the transistor substrate 210 and a glass substrate 211. The conductors 201 are located in the direction opposite to that in which the light is output so that it is possible to prevent the conductors 210 from interfering with the light.

Figure 14:
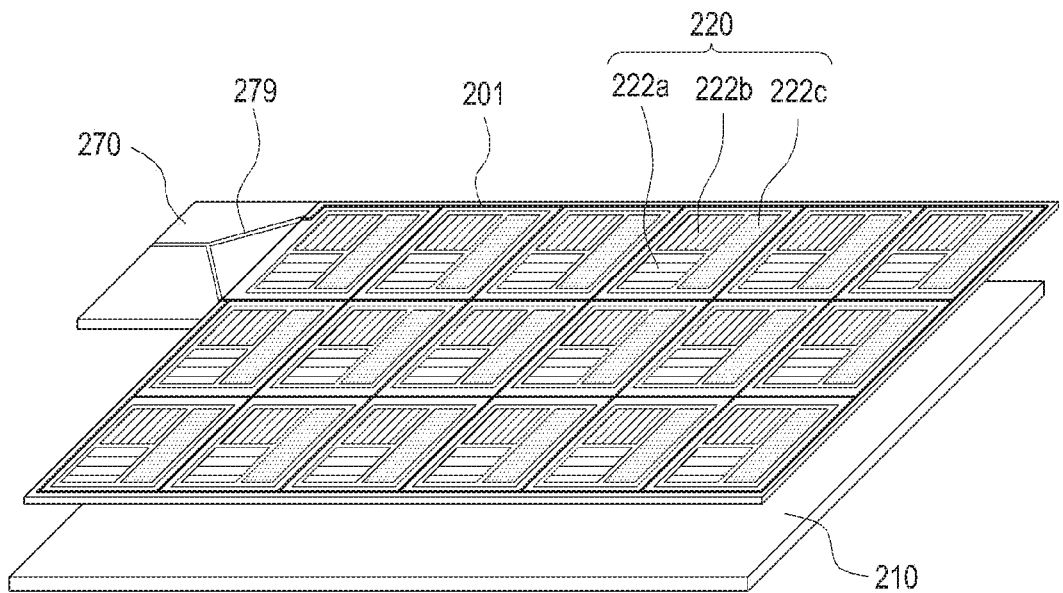
FIG. 14 is a view illustrating an antenna radiator and a feeding PCB of a display device according to an embodiment of the present disclosure.

FIG. 14 is a view illustrating an antenna radiator and a feeding PCB of the display device 200 according to an embodiment of the present disclosure. Elements that are similar to those described above and/or can be easily understood through the description above may be provided with identical reference numerals, or the reference numerals may be omitted. Also, detailed descriptions thereof will be omitted.

Referring to FIG. 14, the display device 200, according to an embodiment of the present disclosure, may further include a feeding PCB 270 that is connected to one end of the negative electrode 202.

The feeding PCB 270 may have a feeding line 279 that is electrically connected with the conductors 201. The feeding line 279 may supply an electrical signal to the conductors 201 so that the antenna radiator 105 constituted by the conductors 201 may transmit and receive electrical waves.

Each of the pixels 220 may include a first pixel 222a, a second pixel 222b, and a third pixel 222c that are separated from each other by the partition walls 212 (illustrated in FIG. 13). The first pixel 222a may output red light, the second pixels 222b may output green light, and the third pixel 222c may output blue light. For example, the first pixel 222a, the second pixel 222b, and the third pixel 222c, which are adjacent to each other, may be combined with each other to form the pixel 220 that may individually output red light, green light, and blue light.

The conductors 201 may be disposed between the pixels 220 to form a mesh of antenna radiator 105. The antenna radiator 105 may transmit and receive electrical waves. Further, according to an embodiment of the present disclosure, some of the conductors 201 may be disposed between the first and second pixels 222a and 222b, between the first and third pixels 222a and 222c, or between the second and third pixels 222b and 222c.

Figure 15:
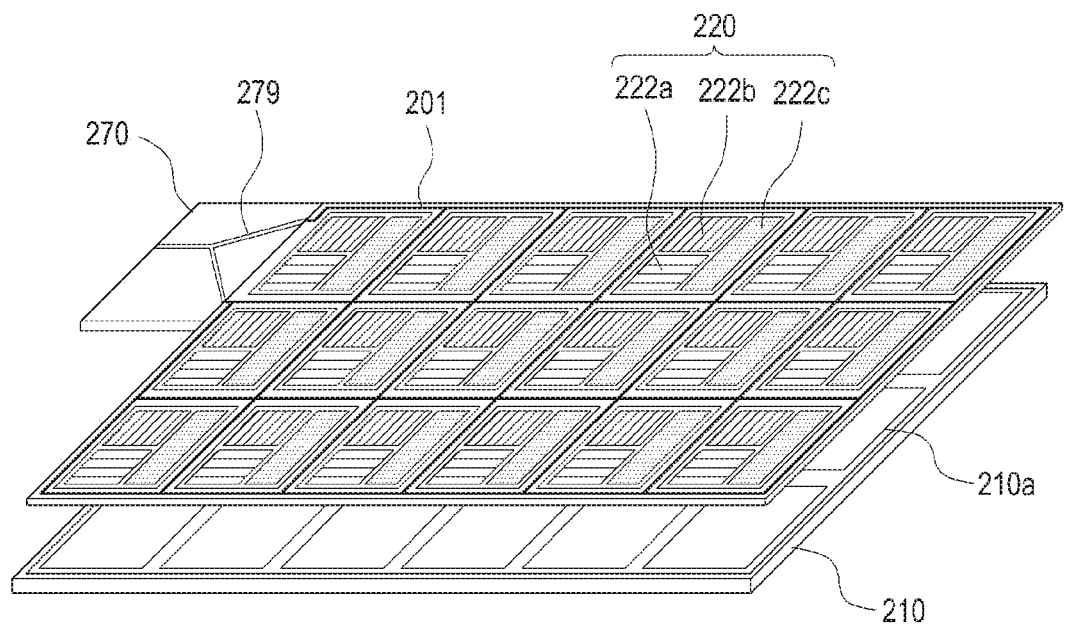
FIG. 15 is a view illustrating a state in which a transistor substrate of a display device, according to an embodiment of the present disclosure, is segmented.
Figure 16:
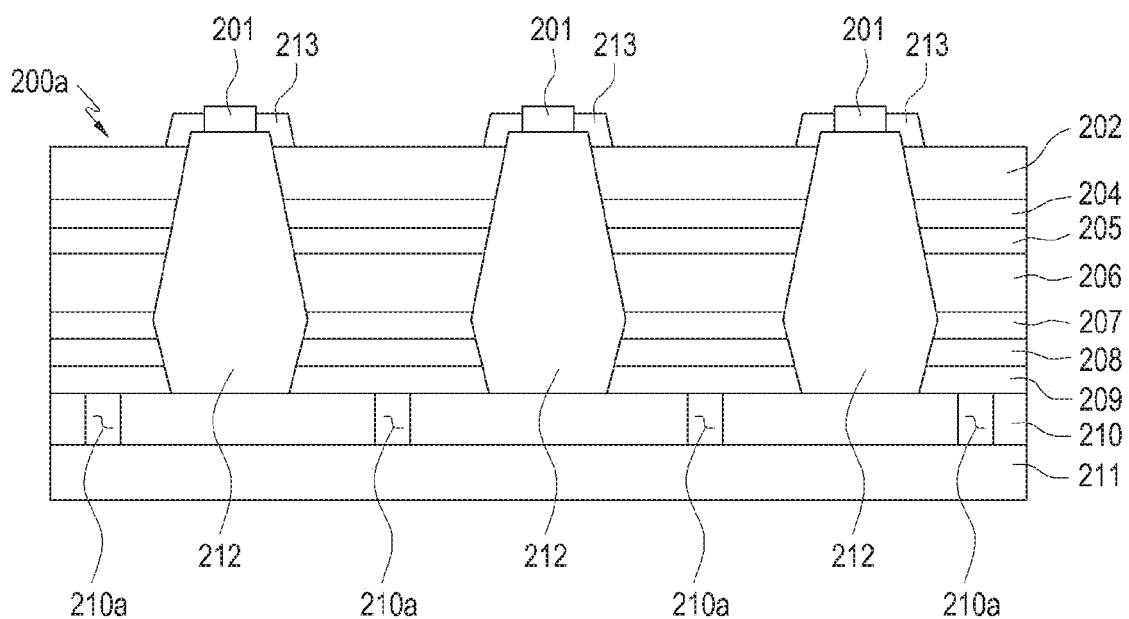
FIG. 16 is a sectional view illustrating a display device according to an embodiment of the present disclosure.

FIG. 15 is a view illustrating a state in which a transistor substrate of the display device 200, according to an embodiment of the present disclosure, is segmented. FIG. 16 is a sectional view illustrating the display device 200 according to an embodiment of the present disclosure. Elements that are similar to described above and/or can be easily understood through the description above may be provided with identical reference numerals, or the reference numerals may be omitted. Also, detailed descriptions thereof are omitted.

Referring to FIGS. 15 and 16, the transistor substrate 210 may have transistor slots 210a formed therein. The transistor slots 210a may be formed along a first direction, or may be formed along a direction perpendicular to the first direction. Electrical waves formed by the conductors 201 may travel while passing through the transistor substrate 210 via the transistor slots 210a.

Figure 17:
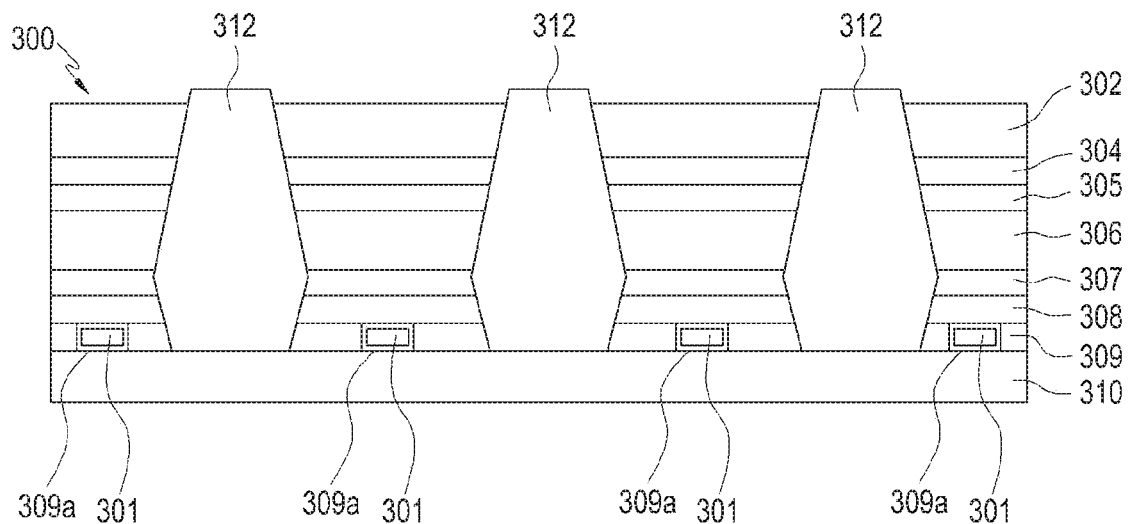
FIG. 17 is a sectional view illustrating a display device according to an embodiment of the present disclosure.

FIG. 17 is a sectional view illustrating a display device 300 according to an embodiment of the present disclosure.

Referring to FIG. 17, the display device 300, according to an embodiment of the present disclosure, may include a light emitting layer 306, partition walls 312, conductors 301, hole transport layers 307 and 308, a positive electrode 309, electron transport layers 304 and 305, a negative electrode 302, and a transistor substrate 310. Elements that are similar to those described above and/or can be easily understood through the description above may be provided with identical reference numerals, or the reference numerals may be omitted. Also, detailed descriptions thereof are omitted. The arrangement of the conductors 301 are described below.

The conductors 301 may be provided in the positive electrode 309. The conductors 301 may be surrounded by positive-electrode insulating parts 309a so as to be electrically insulated from the positive electrode 309. The conductors 301 may be formed of silver (Ag). Without being limited thereto, however, the conductors 301 may be formed of various materials capable of radiating electrical waves. The positive-electrode insulating parts 309a may form an airgap, or may be formed of an inorganic material, to electrically insulate the conductors 301 from the positive electrode 309.

Accordingly, when the light emitting layer 306 outputs light toward the negative electrode 302, it is possible to prevent the output light from interfering with the conductors 301 because the conductors 301 are located in the direction opposite to that in which the light is output (e.g., the direction in which an image is displayed on the display device 300).

Figure 18:
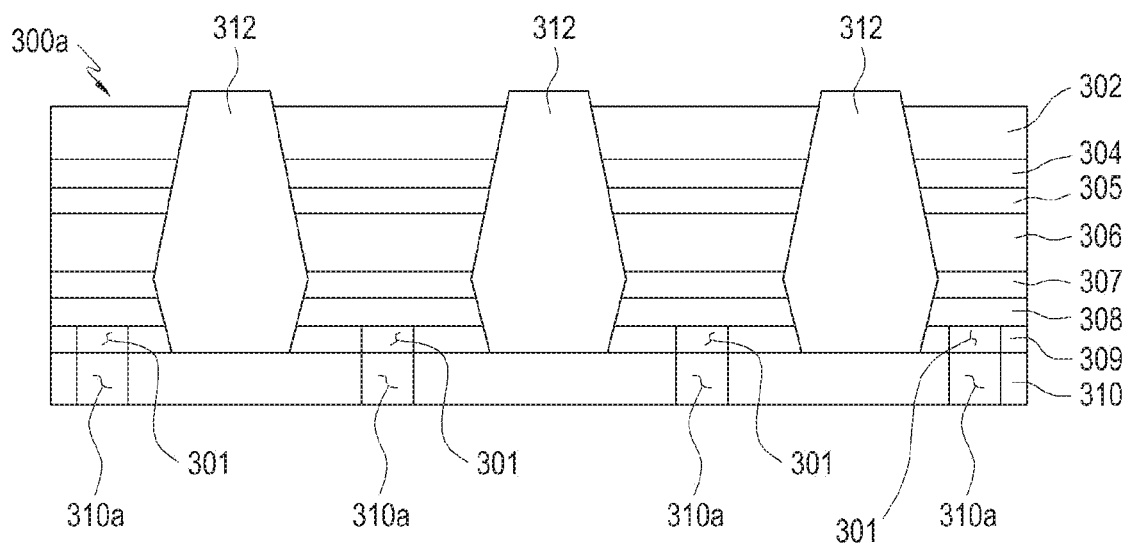
FIG. 18 is a sectional view illustrating a display device according to an embodiment of the present disclosure.

FIG. 18 is a sectional view illustrating a display device 300a according to an embodiment of the present disclosure. Elements that are similar to those described above and/or can be easily understood through the description above may be provided with identical reference numerals, or the reference numerals may be omitted. Also, detailed descriptions thereof are omitted.

Referring to FIG. 18, the display device 300a, according to an embodiment of the present disclosure, may include a positive electrode 309 having conductors 301 therein and a transistor substrate 310 having transistor slots 310a formed therein.

The transistor slots 310a may be formed in positions corresponding to the conductors 301. Without being limited thereto, however, the transistor slots 310a may be formed in various patterns on the transistor substrate 310. Electrical waves formed by the conductors 301 may passing through the transistor substrate 310 via the transistor slots 310a.

Figure 19:
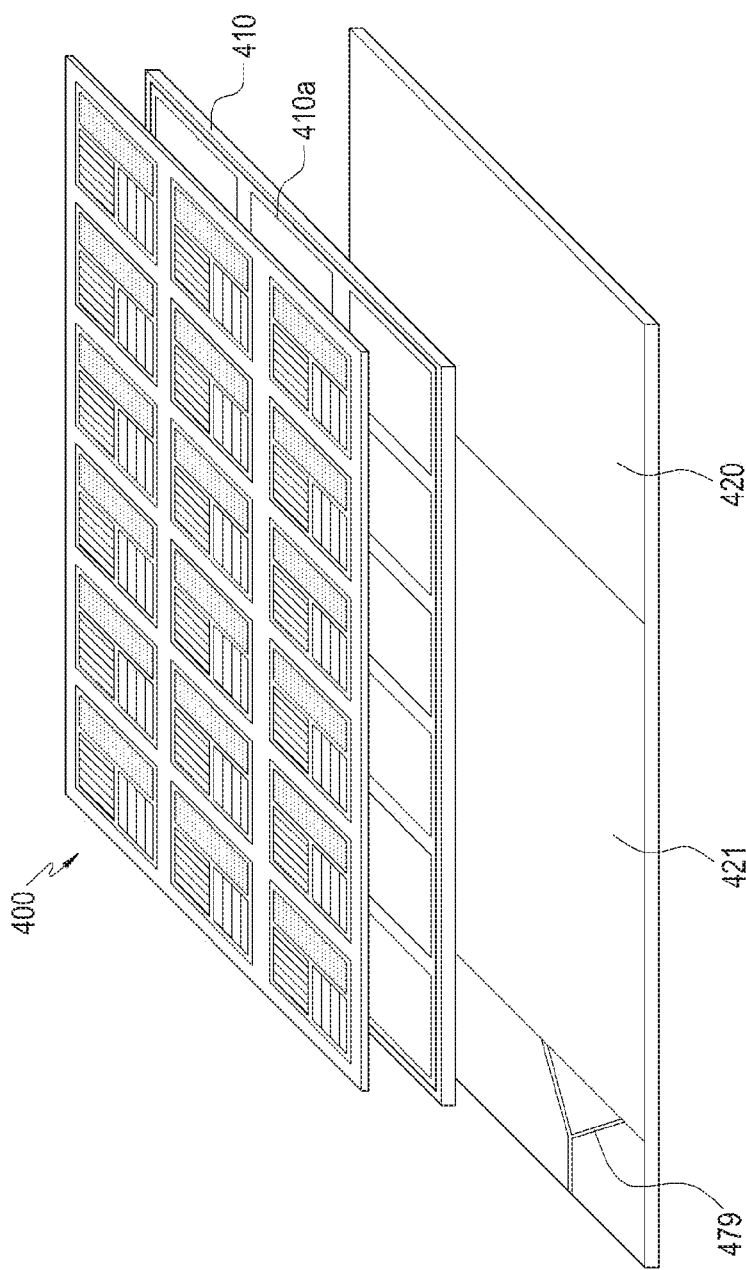
FIG. 19 is a view illustrating a display device, according to an embodiment of the present disclosure, and a second antenna unit.
Figure 20:
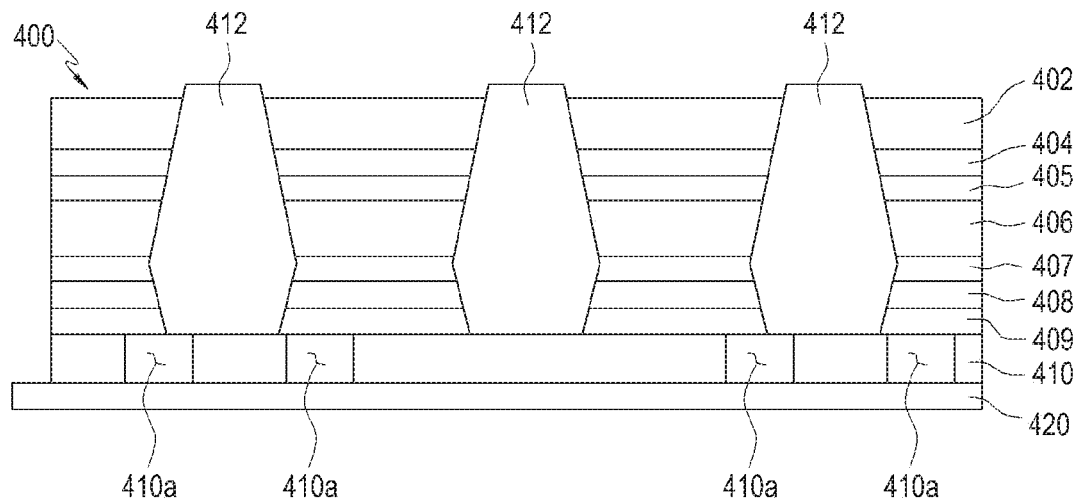
FIG. 20 is a sectional view illustrating a display device, according to an embodiment of the present disclosure, and a second antenna unit.

FIG. 19 is a view illustrating a display device 400, according to an embodiment of the present disclosure, and a second antenna unit. FIG. 20 is a sectional view illustrating the display device 400, according to an embodiment of the present disclosure, and the second antenna unit.

Referring to FIGS. 19 and 20, the display device 400, according to an embodiment of the present disclosure, may include a light emitting layer 406, partition walls 412, a circuit board 420, hole transport layers 407 and 408, a positive electrode 409, electron transport layers 404 and 405, a negative electrode 402, and a transistor substrate 410. Elements that are similar to those described above and/or can be easily understood through the description above may be provided with identical reference numerals, or the reference numerals may be omitted. Also, detailed descriptions thereof are omitted. An antenna radiator 421 that is disposed on the circuit board 420 is described below.

The circuit board 420 may be provided on the bottom of the transistor substrate 410 (e.g., on the surface opposite to that where the positive electrode 409 makes contact with the transistor substrate 410). The antenna radiator 421 may be provided on the circuit board 420. A feeding line 479 that feeds an electrical signal to the antenna radiator 421 may be provided on the circuit board 420. The antenna radiator 421 may be formed in various patterns (such as a mesh, etc.) on the circuit board 420. The antenna radiator 421 is disposed in the direction opposite to that in which the light emitting layer 406 outputs light so that it is possible to prevent the antenna radiator 421 from interfering with the output light.

Further, the transistor substrate 410 may have transistor slots 410a formed therein. Electrical waves formed by the antenna radiator 421 may passing through the transistor substrate 410 via the transistor slots 410a. Accordingly, it is possible to reduce the loss of the electrical waves, as compared to electrical waves directly passing through the transistor substrate 410.

Figure 21:
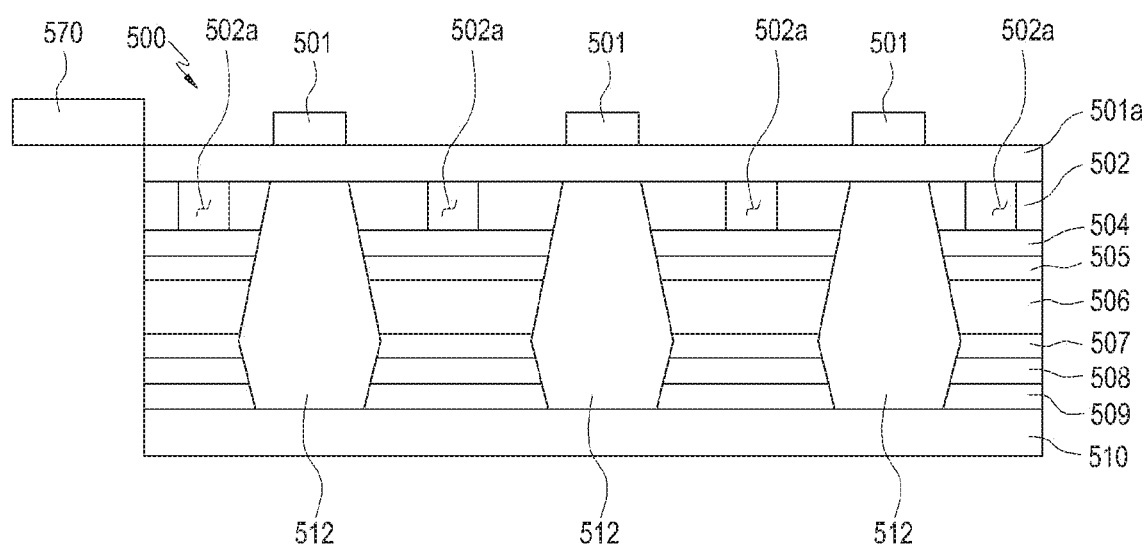
FIG. 21 is a sectional view illustrating a display device according to an embodiment of the present disclosure.

FIG. 21 is a sectional view illustrating a display device 500 according to an embodiment of the present disclosure.

Referring to FIG. 21, the display device 500, according to an embodiment of the present disclosure, may include a light emitting layer 506, partition walls 512, conductors 501, hole transport layers 507 and 508, a positive electrode 509, electron transport layers 504 and 505, a negative electrode 502, and a transistor substrate 510. Elements that are similar to those described above and/or can be easily understood through the description above may be provided with identical reference numerals, or the reference numerals may be omitted. Also, detailed descriptions thereof are omitted.

The conductors 501 and the negative electrode 502 may be disposed in different layers. An insulating part 501a may be provided between the conductors 501 and the negative electrode 502 to block an electrical connection between the conductors 501 and the negative electrode 502.

A feeding PCB 570 may be provided in the same layer together with the conductors 501. The feeding PCB 570 may have a feeding line that is electrically connected to the conductors 501 and may feed an electrical signal to the conductors 501 through the feeding line.

The negative electrode 502 may have negative-electrode slots 502a formed therein. Electrical waves formed by the conductors 501 may be radiated toward the transistor substrate 510 through the negative-electrode slots 502a. Accordingly, it is possible to prevent the electrical waves from interfering with the negative electrode 502.

Figure 22:
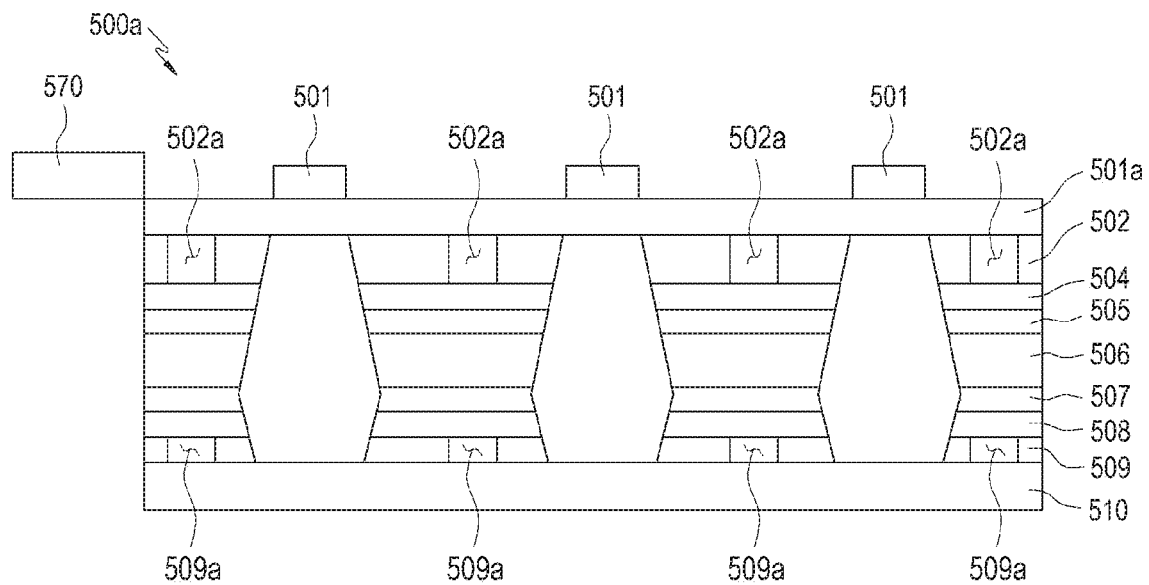
FIG. 22 is a sectional view illustrating a display device according to an embodiment of the present disclosure.

FIG. 22 is a sectional view illustrating a display device 500a according to an embodiment of the present disclosure. Elements that are similar to those described above and/or can be easily understood through the description above may be provided with identical reference numerals, or the reference numerals may be omitted. Also, detailed descriptions thereof are omitted.

Referring to FIG. 22, the display device 500a, according to an embodiment of the present disclosure, may include positive-electrode slots 509a in addition to the negative-electrode slots 502a described above.

The positive-electrode slots 509a may be formed in the positive electrode 509 to pass electrical waves that are formed by the conductors 501. Further, the positive-electrode slots 509a may be disposed in the positions corresponding to the negative-electrode slots 502a, but without being limited thereto, may be formed in various patterns in the positive electrode 509.

Figure 23:
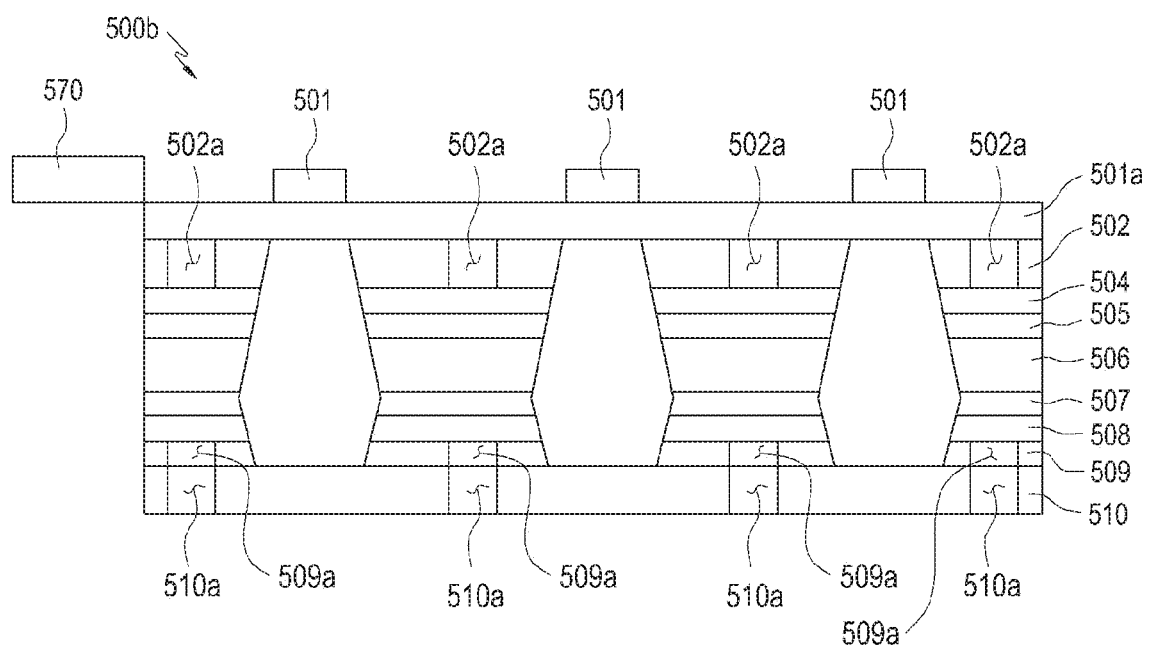
FIG. 23 is a sectional view illustrating a display device according to an embodiment of the present disclosure.

FIG. 23 is a sectional view illustrating a display device 500b according to an embodiment of the present disclosure. Elements that are similar to those in the preceding embodiments and/or can be easily understood through the description above may be provided with identical reference numerals, or the reference numerals may be omitted. Also, detailed descriptions thereof are omitted.

Referring to FIG. 23, the display device 500b, according to an embodiment of the present disclosure, may include transistor slots 510a in addition to the negative-electrode slots 502a and the positive-electrode slots 509a described above.

The transistor slots 510a may be formed in the transistor substrate 510 to pass electrical waves. Further, the transistor slots 510a may be disposed in the positions corresponding to the positive-electrode slots 509a, but without being limited thereto, may be formed in various patterns in the transistor substrate 510.

Figure 24:
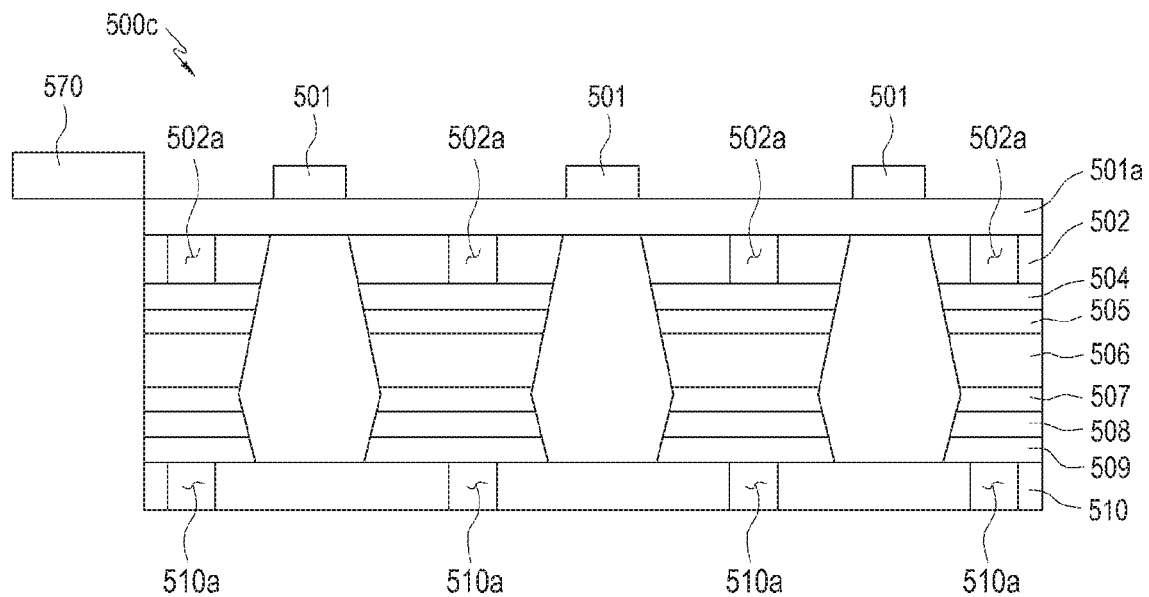
FIG. 24 is a sectional view illustrating a display device according to an embodiment of the present disclosure.

FIG. 24 is a sectional view illustrating a display device 500c according to an embodiment of the present disclosure. Elements that are similar to those described above and/or can be easily understood through the description above may be provided with identical reference numerals, or the reference numerals may be omitted. Also, detailed descriptions thereof are omitted.

Referring to FIG. 24, the display device 500c, according to an embodiment of the present disclosure, may include a combination of the negative-electrode slots 502a and the transistor slots 510a.

Figure 25:
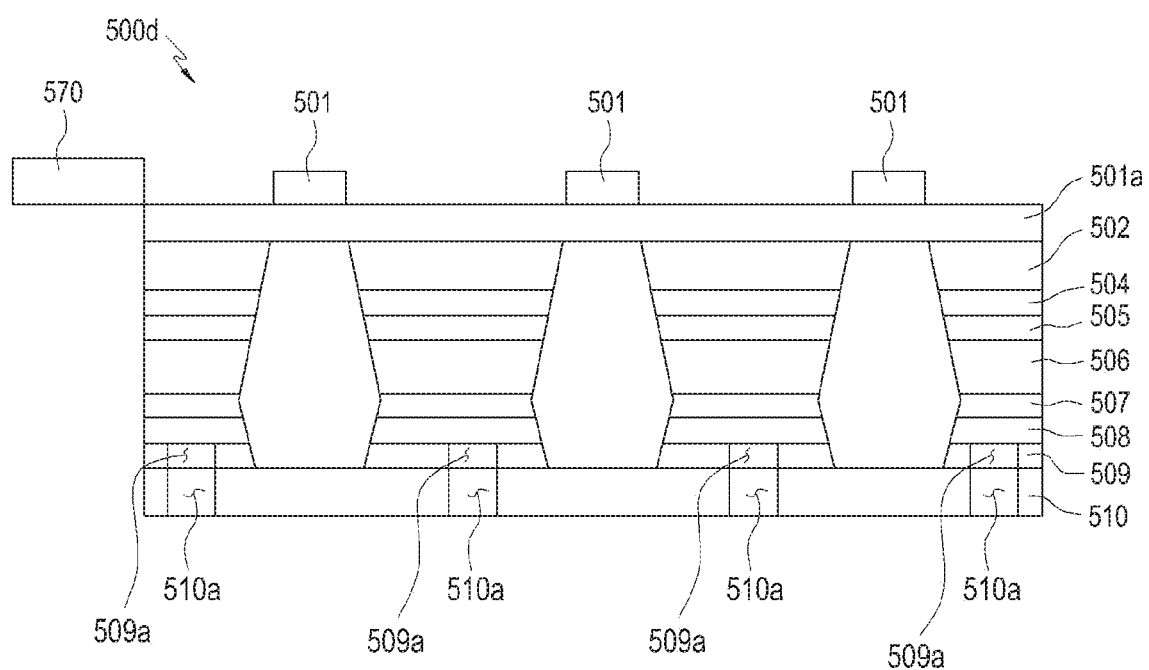
FIG. 25 is a sectional view illustrating a display device according to an embodiment of the present disclosure.

FIG. 25 is a sectional view illustrating a display device 500d according to an embodiment of the present disclosure. Elements that are similar to those described above and/or can be easily understood through the description above may be provided with identical reference numerals, or the reference numerals may be omitted. Also, detailed descriptions thereof are omitted.

Referring to FIG. 25, the display device 500d, according to an embodiment of the present disclosure, may include a combination of the positive-electrode slots 509a and the transistor slots 510a.

Figure 26:
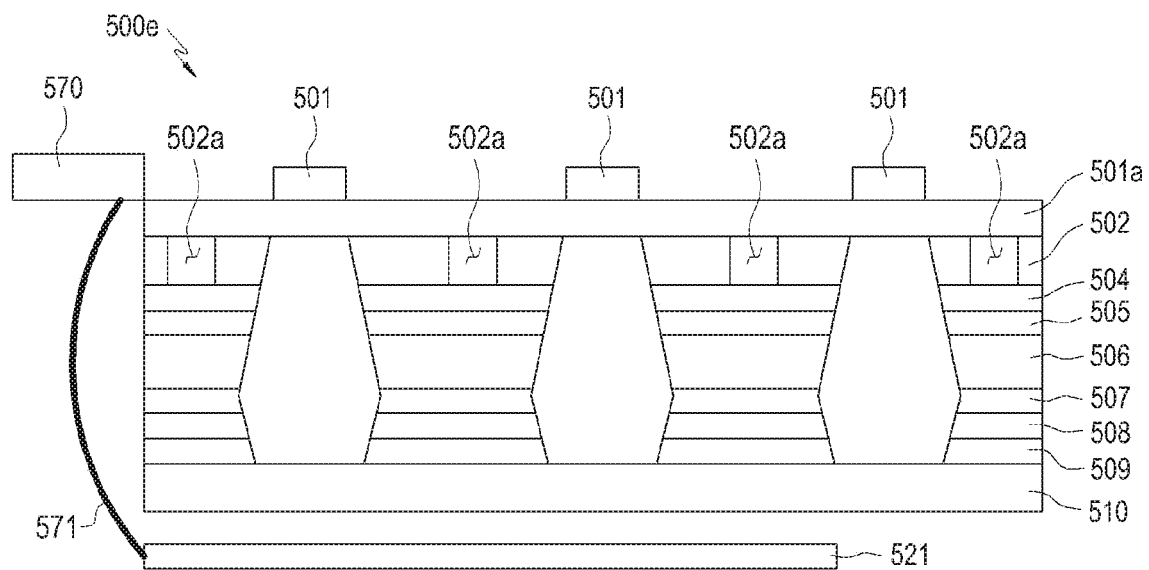
FIG. 26 is a sectional view illustrating a display device according to an embodiment of the present disclosure.

FIG. 26 is a sectional view illustrating a display device 500e according to an embodiment of the present disclosure. Elements that are similar to those described above and/or can be easily understood through the description above may be provided with identical reference numerals, or the reference numerals may be omitted. Also, detailed descriptions thereof are omitted.

Referring to FIG. 26, the display device 500e, according to an embodiment of the present disclosure, may include a circuit board 521 and a connecting PCB 571.

The circuit board 521 may have a second antenna radiator and may be connected to the feeding PCB 570 through the connecting PCB 571. The second antenna radiator may be fed with an electrical signal through the feeding PCB 570 and the connecting PCB 571 to radiate electrical waves. Further, the second antenna radiator may be electrically connected to the conductors 501 through the feeding PCB 570 to perform the function of an antenna radiator together with the conductors 501.

Figure 27:
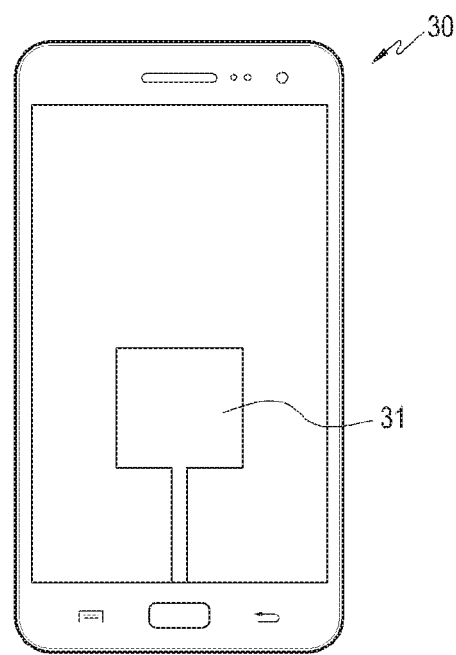
FIG. 27 is a front view illustrating an antenna radiator of an electronic device according to an embodiment of the present disclosure.

FIG. 27 is a front view illustrating an antenna radiator of an electronic device 30 according to an embodiment of the present disclosure.

Referring to FIG. 27, the electronic device 30, according to an embodiment of the present disclosure, may include a single antenna 31 that is formed by the antenna radiator or the second antenna radiator that is configured with the conductors described above.

Figure 28:
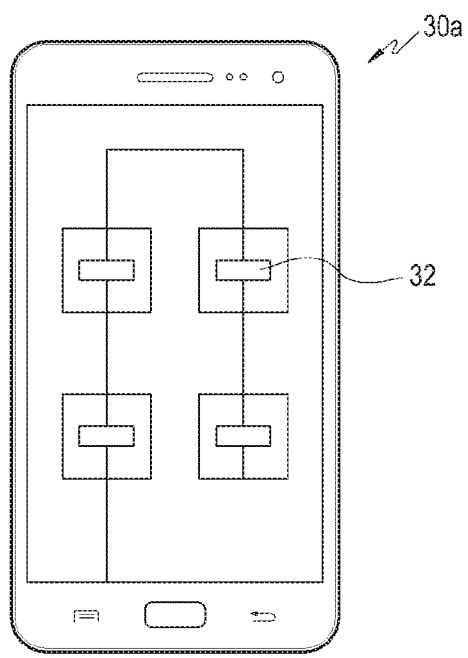
FIG. 28 is a front view illustrating an antenna radiator of an electronic device according to an embodiment of the present disclosure.

FIG. 28 is a front view illustrating an antenna radiator of an electronic device 30a according to an embodiment of the present disclosure.

Referring to FIG. 28, the electronic device 30a, according to an embodiment of the present disclosure, may include an array antenna 32 that is formed by the antenna radiator or the second antenna radiator that is configured with the conductors described above.

Figure 29:
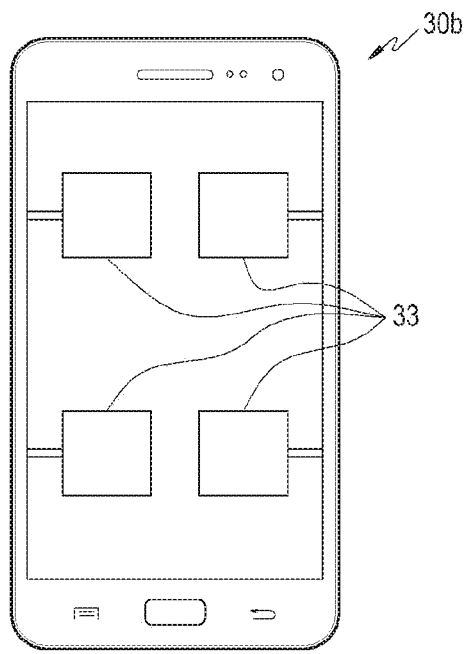
FIG. 29 is a front view illustrating an antenna radiator of an electronic device according to an embodiment of the present disclosure.

FIG. 29 is a front view illustrating an antenna radiator of an electronic device 30b according to an embodiment of the present disclosure.

Referring to FIG. 29, the electronic device 30b, according to an embodiment of the present disclosure, may include a multiple-input-multiple-output (MIMO) antenna 33 that is formed by the antenna radiator or the second antenna radiator that is configured with the conductors described above.

Figure 30:
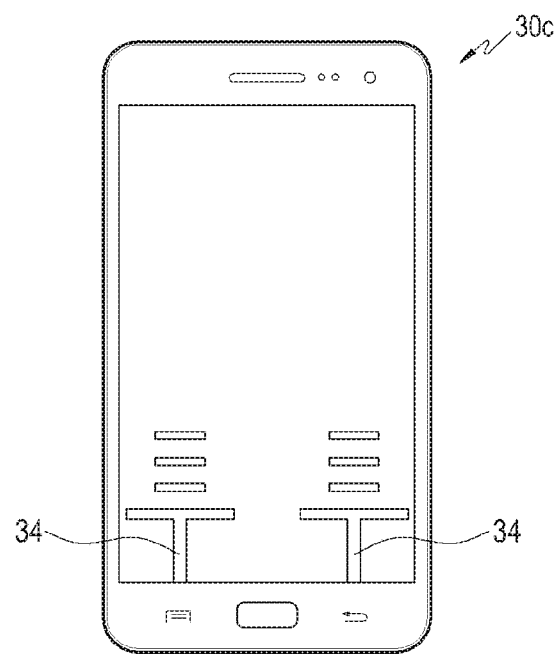
FIG. 30 is a front view illustrating an antenna radiator of an electronic device according to an embodiment of the present disclosure.

FIG. 30 is a front view illustrating an antenna radiator of an electronic device 30c according to an embodiment of the present disclosure.

Referring to FIG. 30, the electronic device 30c, according to an embodiment of the present disclosure, may include an end-fire antenna 33 that is formed by the antenna radiator or the second antenna radiator that is configured with the conductors described above.

As described above, a display device, according to various embodiments of the present disclosure, may include a plurality of pixels arranged with an interval therebetween; and an antenna radiator configured with one or more conductors that are arranged between the pixels.

According to various embodiments of the present disclosure, the antenna radiator may be located within the layer that is formed by the pixels.

According to various embodiments of the present disclosure, the pixels may output one of red, green, and blue light.

The display device, according to various embodiment of the present disclosure, may further include a light shielding part disposed between the pixels, where the light shielding part may prevent light from passing between the pixels.

According to various embodiments of the present disclosure, the light shielding part may surround the conductors.

According to various embodiments of the present disclosure, the conductors may be provided on one surface of the light shielding part.

According to various embodiments of the present disclosure, the plurality of conductors may extend between the pixels to cross each other, thereby forming the antenna radiator in a mesh.

According to various embodiments of the present disclosure, the antenna radiator may include a cut-off portion where a part of the conductor is removed.

The display device, according to various embodiments of the present disclosure, may further include an output layer on which the pixels are disposed; and a feeding PCB connected to the output layer to provide a path for feeding a current to the conductors.

The display device, according to various embodiments of the present disclosure, may further include a liquid crystal layer disposed on one surface of the output layer; transistors disposed on one surface of the liquid crystal layer to adjust a voltage to be applied to the liquid crystal layer; and a back-light disposed on the transistors to output light to the liquid crystal layer.

The display device, according to various embodiments of the present disclosure, may further include partition walls disposed between the pixels, where each conductor may be disposed on one surface of the corresponding partition wall.

Each pixel of the display device, according to various embodiments of the present disclosure, may include a light emitting layer that outputs light; a hole transport layer disposed on one surface of the light emitting layer to provide a path through which holes are transported to the light emitting layer; a positive electrode that is disposed on one surface of the hole transport layer which generates holes to be supplied to the hole transport layer; an electron transport layer disposed on the opposite surface of the light emitting layer to provide a path through which electrons are transported to the light emitting layer; and a negative electrode that is disposed on the opposite surface of the electron transport layer which generates electrons to be supplied to the electron transport layer, where the light emitting layer may output light by virtue of the holes transported from the hole transport layer and the electrons transported from the electron transport layer.

The display device, according to various embodiments of the present disclosure, may further include a transistor substrate disposed on one surface of the positive electrode.

The display device, according to various embodiments of the present disclosure, may further include one or more slots formed in at least one of the positive electrode, the negative electrode, and the transistor substrate, where at least a part of electrical waves that are transmitted and received through the conductors may through the slots.

The display device, according to various embodiments of the present disclosure, may further include a second antenna radiator provided on one surface of the transistor substrate, and the second antenna radiator may be electrically connected to the conductors.

The display device, according to various embodiments of the present disclosure, may further include one or more slots formed in at least one of the positive electrode, the negative electrode, and the transistor substrate, where at least a part of electrical waves that are transmitted and received through the conductors may travel while passing through the slots.

The conductors of the display device, according to various embodiments of the present disclosure, may be provided on the positive electrode that is disposed in the direction opposite to that in which the pixels output light.

The display device, according to various embodiments of the present disclosure, may further include insulating parts between the conductors and the positive electrode.

According to various embodiments of the present disclosure, the insulating parts may be formed of an inorganic material.

A display device, according to various embodiments of the present disclosure, may include a substrate; a plurality of light emitting parts arranged on the substrate with an interval therebetween; and an antenna radiator constituted by one or more conductors that are arranged between the substrate and the light emitting parts.

According to various embodiments of the present disclosure, the substrate may include a plurality of transistors that are arranged to correspond to the respective light emitting parts.

While the present disclosure has been shown and described with reference to certain embodiments thereof, it will be understood by those skilled in the art that various changes in form and details may be made therein without departing from the scope and spirit of the present disclosure as defined by the appended claims and their equivalents.

What is claimed is:

1. A display device, comprising:
   a plurality of pixels arranged with an interval therebetween;
   an antenna radiator configured with one or more conductors that are arranged between the plurality of pixels;
   partition walls disposed between the plurality of pixels; and
   insulating parts disposed adjacent to the one or more conductors, to electrically insulate one or more conductors from the plurality of pixels,
   wherein each of the one or more conductors is disposed directly on one surface of the corresponding partition wall.

2. The display device of claim 1, wherein each of the plurality of pixels comprises:
   a light emitting layer configured to output light;
   a hole transport layer disposed on a first surface of the light emitting layer and configured to provide a path through which holes are transported to the light emitting layer;
   a positive electrode disposed on one surface of the hole transport layer and configured to generate holes to be supplied to the hole transport layer;
   an electron transport layer having a first surface disposed on a second surface of the light emitting layer and configured to provide a path through which electrons are transported to the light emitting layer; and
   a negative electrode disposed on a second surface of the electron transport layer and configured to generate electrons to be supplied to the electron transport layer,
   wherein the light emitting layer is configured to output light by virtue of the holes transported from the hole transport layer and the electrons transported from the electron transport layer.

3. The display device of claim 2, further comprising a transistor substrate disposed on a first surface of the positive electrode.

4. The display device of claim 3, further comprising one or more slots formed in at least one of the positive electrode, the negative electrode, and the transistor substrate,
   wherein at least a part of electrical waves that are transmitted and received through the one or more conductors passing through the one or more slots.

5. The display device of claim 3, further comprising a second antenna radiator provided on a first surface of the transistor substrate,
wherein the second antenna radiator is electrically connected to the one or more conductors.

6. The display device of claim 5, further comprising one or more slots formed in at least one of the positive electrode, the negative electrode, and the transistor substrate,
wherein at least a part of electrical waves that are transmitted and received through the one or more conductors passing through the one or more slots.

7. The display device of claim 2, wherein the one or more conductors are provided on the positive electrode that is disposed in a direction opposite to that in which the plurality of pixels output light.

8. The display device of claim 7, further comprising the insulating parts between the one or more conductors and the positive electrode.

9. The display device of claim 8, wherein the insulating parts are formed of an inorganic material.

10. A display device, comprising:
a substrate;
a plurality of light emitting parts arranged on the substrate with an interval therebetween; and
an antenna radiator configured with one or more conductors that are arranged between the substrate and the light emitting parts,
wherein the one or more conductors overlap with the light emitting parts,
wherein the substrate comprises a plurality of transistors that are arranged to correspond to the respective light emitting parts.

* * * * *